United States Patent
Kim et al.

(10) Patent No.: US 7,679,928 B2
(45) Date of Patent: Mar. 16, 2010

(54) SYSTEM-IN-PACKAGE MODULE AND MOBILE TERMINAL HAVING THE SAME

(75) Inventors: Tae Hyun Kim, Suwon-si (KR); Sung Taek Kwon, Yongin-si (KR); Tae Ha Lee, Seongnam-si (KR); Dong Kuk Kim, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/232,251

(22) Filed: Sep. 12, 2008

(65) Prior Publication Data

US 2010/0002407 A1 Jan. 7, 2010

(30) Foreign Application Priority Data

Jul. 4, 2008 (KR) .................. 10-2008-0064878

(51) Int. Cl.
*H05K 7/10* (2006.01)
(52) U.S. Cl. .................. 361/767; 361/803; 257/686
(58) Field of Classification Search .................. 361/767, 361/803; 257/686
See application file for complete search history.

(56) References Cited

U.S. PATENT DOCUMENTS

| | | | |
|---|---|---|---|
| 6,836,021 B2 | 12/2004 | Ishikawa et al. | |
| 2004/0095736 A1* | 5/2004 | Choi et al. | 361/803 |
| 2004/0178502 A1* | 9/2004 | Ishikawa et al. | 257/737 |
| 2006/0113677 A1 | 6/2006 | Kuroda et al. | |
| 2007/0037321 A1 | 2/2007 | Higashino et al. | |
| 2007/0057357 A1 | 3/2007 | Chen | |
| 2007/0066044 A1* | 3/2007 | Abe et al. | 438/612 |

FOREIGN PATENT DOCUMENTS

| | | |
|---|---|---|
| DE | 10 2004 001 829 A1 | 9/2004 |
| KR | 10-2007-0019359 | 2/2007 |
| KR | 10-2007-0111286 | 11/2007 |

OTHER PUBLICATIONS

German Office Action issued on Mar. 24, 2009 in corresponding German Patent Application 10 2008 038 302.3.

* cited by examiner

*Primary Examiner*—Jinhee J Lee
*Assistant Examiner*—Andargie M Aychillhum

(57) ABSTRACT

Provided is a system-in-package module including a system circuit board; a first element that is disposed on the system circuit board; a second element that is disposed on the first element so as to be shifted to one side from the center of the first element, while partially exposing the first element; a third element that is electrically connected to the system circuit board and is disposed on the second element; and a plurality of bump pads that are disposed on the bottom surface of the system circuit board.

2 Claims, 3 Drawing Sheets

[FIG. 1]
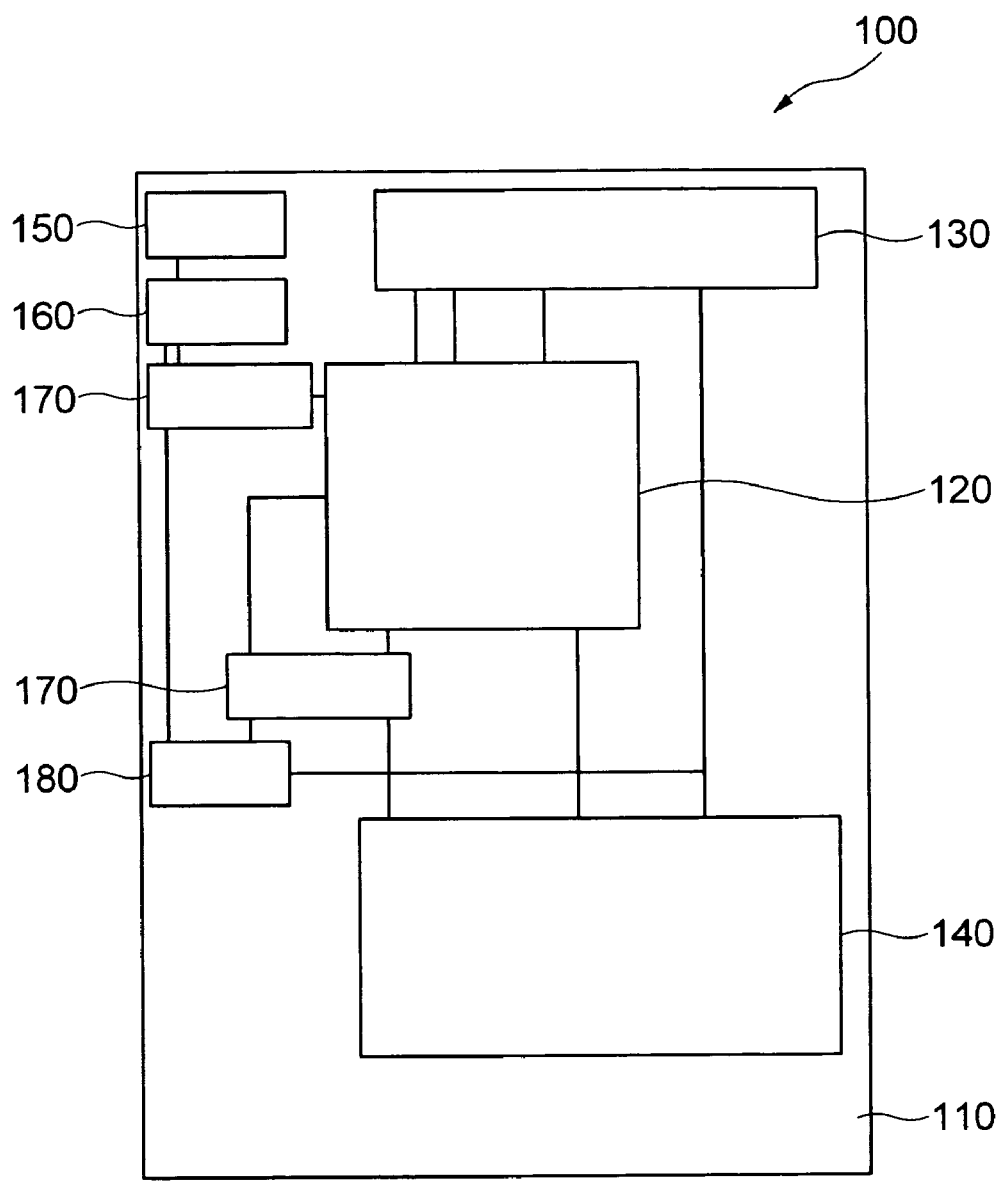

[FIG. 2]
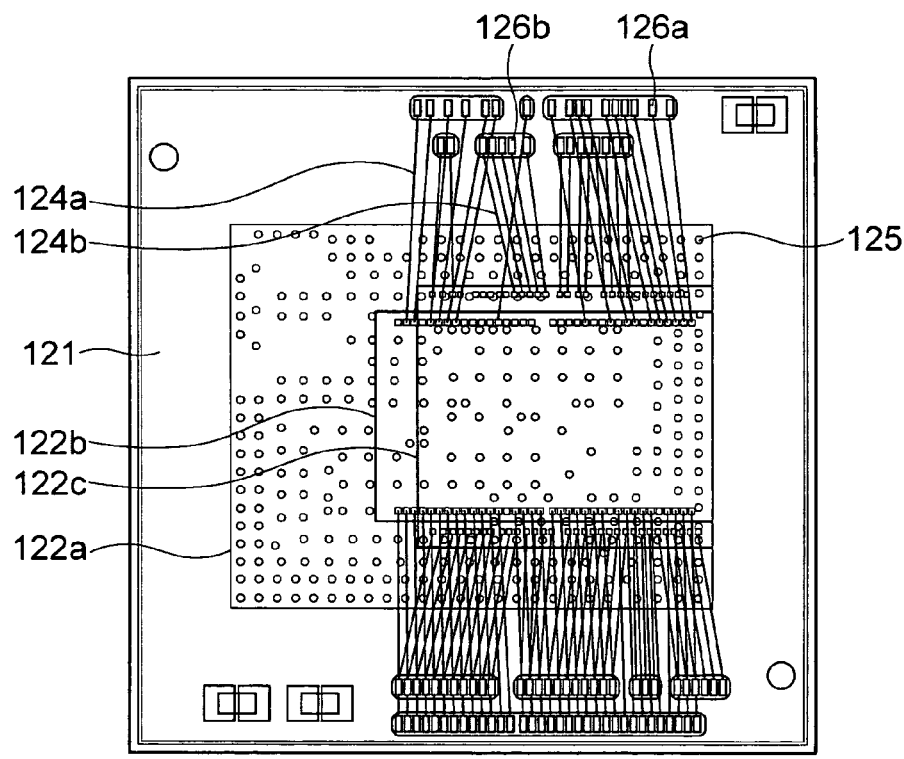
[FIG. 3]
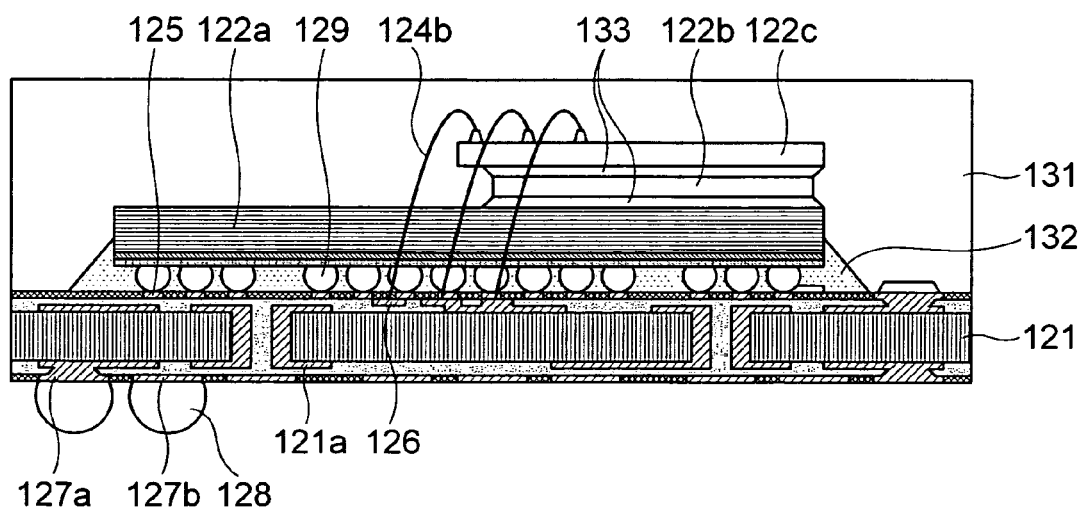

[FIG. 4]
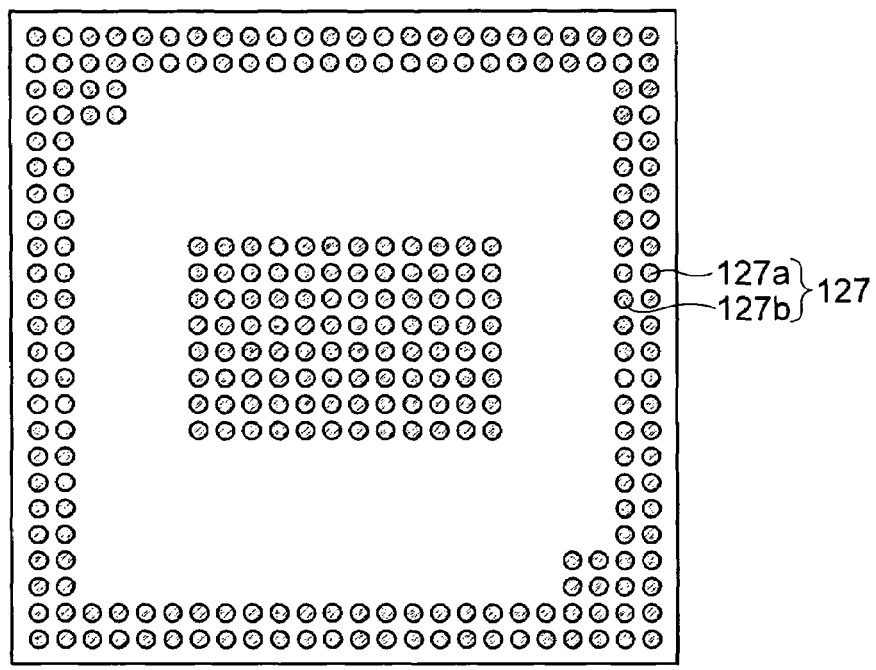
[FIG. 5]
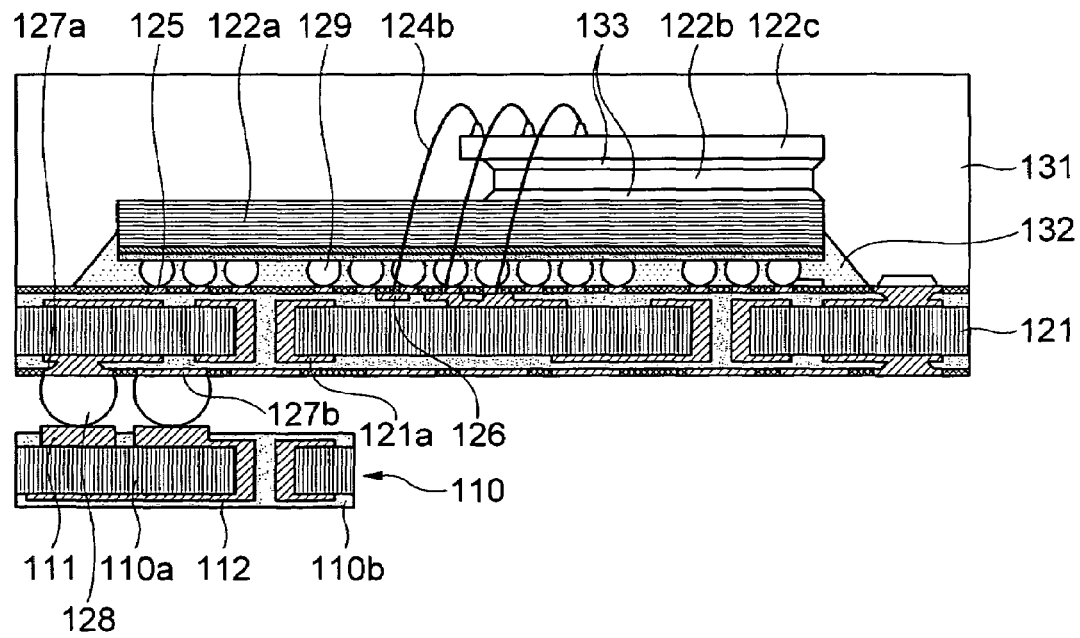

SYSTEM-IN-PACKAGE MODULE AND MOBILE TERMINAL HAVING THE SAME

CROSS-REFERENCE TO RELATED APPLICATIONS

This application claims the benefit of Korean Patent Application No. 10-2008-0064878 filed with the Korea Intellectual Property Office on Jul. 4, 2008, the disclosure of which is incorporated herein by reference.

BACKGROUND OF THE INVENTION

1. Field of the Invention

The present invention relates to a system-in-package module and a mobile terminal having the same, in which the system-in-package module having at least three elements laminated therein is mounted on a main board, thereby reducing the number of layers of the main board.

2. Description of the Related Art

With the rapid development of the electronic and information industry, the development of mobile terminals in a mobile communication field has been significantly achieved. In addition to a basic communication function, the mobile terminals include additional functions such as game, digital camera, display and so on. Therefore, the mobile terminals are widely used by a large number of users.

A mobile terminal includes active elements and passive elements mounted on a main board, for example, RF IC, PM IC, memory and so on. Since the main board includes a plurality of signal wiring lines for applying signals to the respective elements, the main board has a structure of at least six or more layers.

Therefore, the manufacturing cost of the main board increases, and thus the manufacturing cost of the mobile terminal inevitably increases. Further, as the competition in the mobile terminal industry becomes keen, the price of the mobile terminal should be considered.

Further, as the passive and active elements are individually arranged on the main board, the mounting area of the elements increases. As a result, the size of the main board increases.

SUMMARY OF THE INVENTION

An advantage of the present invention is that it provides a system-in-package module and a mobile terminal having the same, in which the system-in-package module having at least three elements laminated therein is mounted on a main board, thereby reducing the number of layers of the main board. Therefore, it is possible to reduce the size and cost of the mobile terminal.

Additional aspect and advantages of the present general inventive concept will be set forth in part in the description which follows and, in part, will be obvious from the description, or may be learned by practice of the general inventive concept.

According to an aspect of the invention, a system-in-package module comprises a system circuit board; a first element that is disposed on the system circuit board; a second element that is disposed on the first element so as to be shifted to one side from the center of the first element, while partially exposing the first element; a third element that is electrically connected to the system circuit board and is disposed on the second element; and a plurality of bump pads that are disposed on the bottom surface of the system circuit board.

The first element may be a chip which includes an RF (Radio Frequency) signal processing unit, a baseband processing unit, and a power management unit, the second element may be a flash memory, and the third element may be PSRAM (Pseudo Static Random Access Memory).

The exposed portion of the first element may be a region where the RF signal processing unit is to be formed.

The first element and the system circuit board may be electrically connected to each other through flip-chip bonding.

The second element and the system circuit board may be electrically connected to each other through wire bonding.

The third element and the system circuit board may be electrically connected to each other through wire bonding.

The plurality of bump pads may be arranged in two or three lines.

According to another aspect of the invention, a mobile terminal comprises a system-in-package module including: a system circuit board; a first element that is disposed on the system circuit board; a second element that is disposed on the first element so as to be shifted to one side from the center of the first element, while partially exposing the first element; a third element that is electrically connected to the system circuit board and is disposed on the second element; and a plurality of bump pads that are disposed on the bottom surface of the system circuit board; and a main board with a double-sided structure that has circuit patterns provided on the top and bottom surfaces thereof, the circuit patterns being electrically connected to the bump pads.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a block diagram of a mobile terminal according to an embodiment of the invention;

FIG. 2 is a plan view of a system-in-package module according to the invention;

FIG. 3 is a cross-sectional view of the system-in-package module according to the invention;

FIG. 4 is a bottom plan view of the system-in-package module according to the invention; and FIG. 5 is a cross-sectional view of the mobile terminal.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a system-in-package module and a mobile terminal having the same according to the present invention will be described in detail with reference to the accompanying drawings.

FIG. 1 is a block diagram of a mobile terminal according to an embodiment of the invention.

Referring to FIG. 1, the mobile terminal 100 includes a plurality of electronic components mounted on a main board 110. The plurality of electronic components may include a plurality of elements, a display panel connector 130, a keypad module 140, an antenna 150 and so on.

The main board 110 has signal and power lines formed thereon, the signal and power lines delivering signals and power to the plurality of electronic components.

The plurality of elements include a front end module (FEM) 160, a system-in-package module 120, passive elements 170 and so on.

The FEM 160 is a transceiver device which controls radio signals used in the mobile terminal 100.

In the system-in-package module 120, an RF signal processing unit, a baseband processing unit, a power management unit, and a memory unit are mounted on one system circuit board. That is, the respective units can be implemented in one package, which makes it possible to reduce the number of I/O terminals and the number of signal and power wiring lines. Therefore, it is possible to reduce the number of layers of the main board 110 from six to two.

The RF signal processing unit selectively sorts the signals delivered from the FEM 160, and then converts the sorted signals into intermediate-frequency-band signals. The baseband processing unit demodulates the intermediate-frequency-band signals into baseband signals. The memory unit serves to store data for processing signals of the baseband processing unit. The power management unit serves to supply power corresponding to the respective electronic components.

The system-in-package module 120 may further include a switching unit which switches RF signals to selectively transmit and receive, a saw filter which filters RF signals at a corresponding band, and a passive element.

As the system-in-package module 120 is provided on the main board 110, the integration of the main board 110 can be achieved. Accordingly, a signal path is reduced, so that an electrical characteristic can be enhanced.

Referring to FIGS. 2 to 4, the system-in-package module mounted on the mobile terminal shown in FIG. 1 will be described in more detail.

FIG. 2 is a plan view of the system-in-package module according to the invention. FIG. 3 is a cross-sectional view of the system-in-package module according to the invention.

As shown in FIGS. 2 and 3, the system-in-package module 120 includes a system circuit board 121, a first element 122a mounted on the system circuit board 121, a second element 122b disposed on the first element 122a, a third element 122c disposed on the second element 122b, and molding resin 131 which is disposed on the system circuit board 121 so as to protect the first to third elements 122a to 122c.

The system circuit board 121 includes circuit patterns 121a disposed therein and on both surfaces thereof. The circuit patterns 121a may be formed of metal.

The system circuit board 121 may further include first pads 125, second pads 126a, and third pads 126b formed on the top surface thereof. The first pads 125 are electrically connected to the first element 122a. The second pads 126b may be electrically connected to the second element 122b.

The first element 122a is disposed on the top surface of the system circuit board 121. The first element 122a may be a chip in which an RF signal processing unit, a baseband processing unit, and a power management unit are constructed as one module. The first element 122a may further include a switching unit, a saw filter, passive elements and so on. As for the passive elements, a resistor and a capacitor may be exemplified.

On the bottom surface of the first element 122a, a first chip pad (not shown) is formed. In this case, the first element 122a is mounted on the system circuit board 121 by a flip chip bonding method, after connectors 129 such as solder balls or metals are interposed between the first chip pad and the first pads 125 of the system circuit board 121.

Between the first element 122a and the system circuit board 121, underfill resin 132 may be filled so as to reliably fix the first element 122a to the system circuit board 121. The underfill resin 132 may be epoxy resin or epoxy-acid-anhydride resin.

The second element 122b is bonded on the first element 122a through a non-conductive adhesive member 133 disposed on the first element 122a. The second element 122b has a second chip pad (not shown) formed on the top surface thereof.

The second chip pad may be electrically connected to the second pads 126a through wire bonding using first wires 124a.

The second element 122b may be a flash memory.

The second element 122b may be mounted in such a manner that the RF signal processing unit of the first element 122a is exposed. The second element 122b is not disposed in the center of the first element 122a, but is disposed so as to be shifted to one side from the center of the first element 122a. For example, the second element 122b may be disposed on the first element 122a such that one side of the first element 122a is aligned with one side of the second element 122b. Accordingly, since the first wires 124a can be concentrated in the one side, the utilization rate of the system circuit board 121 can be increased, and the size of the system-in-package module 120 can be reduced.

The third element 122c is bonded on the second element 122b through a non-conductive adhesive member 133 disposed on the second element 122b. The third element 122c may be PSRAM (Pseudo Static Random Access Memory).

The third element 122c has a third chip pad (not shown) formed on the top surface thereof. The third chip pad and the third pads 126b may be electrically connected through wire bonding using second wires 124b.

Like the second element 122b, the third element 122c is formed in such a manner that the RF signal processing unit of the first element 122a is exposed. That is, the third element 122b is not disposed in the center of the first element 122a, but is disposed so as to be shifted to one side from the center of the first element 122a. For example, the third element 122c may be disposed on the first element 122a such that the one side of the first element 122a is aligned with one side of the third element 122c. Therefore, the one sides of the first to third elements 122a to 122c may be aligned with one another.

Accordingly, since the first and second wires 124a and 124b can be concentrated in the one side, the utilization rate of the system circuit board 121 can be increased, and the size of the system-in-package module 120 can be reduced.

The molding resin 131 serves to protect the first to third elements 122a to 122c on the system circuit board 121. As for the molding resin 131, silicon-based resin or epoxy molding compound may be used.

As the plurality of elements are packaged as one module, the plurality of elements are connected to each other within the system-in-package module 120. Therefore, a number of signal wiring lines and I/O terminals for connecting the plurality of elements are not necessary, unlike the related art. Therefore, the size of the system-in-package module 120 can be reduced, which makes it possible to increase an element mounting rate.

FIG. 4 is a bottom plan view of the system-in-package module according to the invention.

Referring to FIG. 4, the system circuit board 121 may further include bump pads 127 formed on the bottom surface thereof, the bump pads 127 being bonded to the main board 110 through solder balls.

The bump pads 127 are electrically connected to the main board 110 so as to output signals from the system-in-package module 120 to the outside.

The bump pads 127 may be directly connected to the circuit patterns formed in the system circuit board or on the top surface of the system circuit board through via holes. Alternatively, the bump pads 127 may be electrically connected to the circuit patterns disposed on the bottom surface of the system circuit board 121 through separate wiring lines.

The bump pads 127 may be arranged so as to mark off the surroundings of the first to third elements 122a to 122c. In this case, the bump pads 127 may be arranged in at least two or three lines. As in the system-in-package module 120, the plurality of elements are implemented in one package. Therefore, it is possible to reduce the number of I/O terminals.

FIG. 5 is a cross-sectional view of the mobile terminal.

As shown in FIG. 5, when the bump pads 127 are arranged in two lines, the main board 110 which is electrically connected to the bump pads 127 can be used as a both-sided board with a two-layer structure.

The main board 110 may include an insulating layer 110a, first and second circuit patterns 111 and 112 disposed on both surfaces of the insulating layer 110a, and solder resist 110b.

The first circuit pattern 111 may be disposed on the top surface of the insulating layer 110a. Further, the second circuit pattern 112 may be disposed on the top and bottom surfaces of the insulating layer 110a. The first and second circuit patterns 111 and 112 may be electrically connected to each other through a via hole provided in the insulating layer 110a.

The solder resist 110b covers the circuit patterns while partially exposing the circuit patterns which are to be electrically connected to the system-in-package module 120. At this time, the via hole may be filled with the solder resist 110b. The solder resist 110b serves to protect the circuit patterns 111 and 112 and to insulate the first and second circuit patterns 111 and 112 from each other.

The first circuit pattern 111 may be electrically connected to the bump pads 127a disposed in the first line through the solder balls 128 such that the bump pads 127a can deliver a first signal to the first circuit pattern 111. The second circuit pattern 112 may be electrically connected to the bump pads 127b disposed in the second line through the solder balls 128 such that the bump pads 127b can deliver a second signal to the second circuit pattern 112.

In this embodiment, it has been described that the bump pads 127 are arranged in two lines. However, the arrangement of the bump pads 127 is not limited thereto. That is, when the bump pads 127 are arranged in three lines, the main board 110 which is electrically connected to the bump pads 127 can be used as a both-sided board with a three-layer structure.

Therefore, as the system-in-package module is mounted on the main board, a six-layer main board can be substituted with a both-sided board with a two- or three-layer structure. Therefore, the reduction in thickness of mobile terminals having the system-in-package module can be reduced, which makes it possible to reduce the manufacturing cost.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A system-in-package module comprising:
a system circuit board;
a first element that is a chip which includes a Radio Frequency (RF) signal processing unit, a baseband processing unit, and a power management unit, the first element being disposed on the system circuit board, and the first element and the system circuit board being electrically connected to each other through flip-chip bonding;
a second element that is a flash memory, the second element being disposed on the first element, the second element being positioned to one side of a center of the first element to create an exposed portion of the first element, the RF signal processing unit being formed on the exposed portion of the first element, and the second element and the system circuit board being electrically connected to each other through wire bonding;
a third element that is a Pseudo Static Random Access Memory (PSRAM), the third element being electrically connected to the system circuit board through wire bonding and disposed on the second element; and
a plurality of bump pads disposed on the bottom surface of the system circuit board, the plurality of bump pads being arranged in two or three lines.

2. A mobile terminal comprising:
a system-in-package module including:
a system circuit board;
a first element that is a chip which includes an RF signal processing unit, a baseband processing unit, and a power management unit, the first element being disposed on the system circuit board;
a second element that is a flash memory disposed on the first element, the second element being positioned to one side of a center of the first element so that a portion of the first element is exposed;
a third element that is a PSRAM electrically connected to the system circuit board and disposed on the second element; and
a plurality of bump pads arranged in two or three lines, the plurality of bump pads being disposed on the bottom surface of the system circuit board; and
a main board with a double-sided structure that has circuit patterns provided on the top and bottom surfaces thereof, the circuit patterns being electrically connected to the bump pads, and the main board having a two- or three-layer structure.

* * * * *